United States Patent [19]
Wada et al.

[11] Patent Number: 5,886,388
[45] Date of Patent: Mar. 23, 1999

[54] STATIC SEMICONDUCTOR MEMORY DEVICE AND MANUFACTURING METHOD THEREOF

[75] Inventors: Tomohisa Wada; Hirotada Kuriyama, both of Hyogo, Japan

[73] Assignee: Mitsubishi Denki Kabushiki Kaisha, Tokyo, Japan

[21] Appl. No.: 10,473

[22] Filed: Jan. 21, 1998

[30] Foreign Application Priority Data

Jul. 28, 1997 [JP] Japan .................................. 9-201363

[51] Int. Cl.[6] ........................... H01L 29/76; H01L 29/94; H01L 31/062; H01L 31/113
[52] U.S. Cl. ............................................. 257/393; 257/903
[58] Field of Search ...................... 257/393, 903

[56] References Cited

U.S. PATENT DOCUMENTS 4,910,576  3/1990  Campbell et al. .
5,206,533  4/1993  Houston .
5,646,423  7/1997  Megaro et al. .

FOREIGN PATENT DOCUMENTS 62-81055   4/1987   Japan .
4-215473   8/1992   Japan .
4-359562   12/1992  Japan .
5-174580   7/1993   Japan .

Primary Examiner—Stephen D. Meier
Attorney, Agent, or Firm—McDermott, Will & Emery

[57] ABSTRACT

NMOS transistors as well as pMOS transistors are formed in an SOI layer. One of the impurity diffusion regions of the transistors are respectively connected. A longitudinal end of polysilicon layer extends in one direction to be connected to one of the impurity diffusion regions of transistor. A longitudinal end of a polysilicon layer extends in a direction which is opposite from the above mentioned one direction to be connected to one of the impurity diffusion regions of transistor. As a result, the area for a memory cell region in a static semiconductor memory device can be reduced, and the interconnection structure can be simplified.

5 Claims, 19 Drawing Sheets

STATIC SEMICONDUCTOR MEMORY DEVICE AND MANUFACTURING METHOD THEREOF

BACKGROUND OF THE INVENTION

1. Field of the Invention

The present invention relates to static semiconductor memory devices and manufacturing methods thereof, and more specifically, to a structure of a memory cell for storing one-bit information in a static semiconductor memory device and a manufacturing method thereof.

2. Description of the Background Art

FIG. 26 shows an equivalent circuit of a memory cell in a static semiconductor memory device. With reference to FIG. 26, n type MOS (Metal Oxide Semiconductor) transistors (driver transistors) Q1 and Q2, p type MOS transistors (load transistors) Q3 and Q4, and n type MOS transistors (access transistors) Q5 and Q6 are formed within the memory cell in the static semiconductor memory device.

N type MOS transistors Q1 and Q2 are connected between a ground line (GND line) and a pair of storage nodes of the memory cell. P type MOS transistors Q3 and Q4 are connected between a power supply line (Vcc line) and the pair of storage nodes. N type MOS transistors Q5 and Q6 have source/drain terminals connected between one of a pair of bit lines BIT and /BIT, and one of the pair of storage nodes of the memory cell. The gates of n type MOS transistors Q5 and Q6 are connected to a word line.

FIGS. 27 and 28 are plan views showing an example of a memory cell in a conventional static semiconductor memory device having the above mentioned structure. It is noted that the structure is separated into plan views in FIGS. 27 and 28 for the convenience of description, as the memory cell in the static semiconductor memory device includes multiple layers. Also, in FIGS. 27 and 28, the region surrounded by a dotted line is a region for the one-bit memory cell. Memory cells are two-dimensionally arranged in a manner symmetrically folded at each side of the region, a side defining a boundary of the region, to form a memory array.

As shown in FIG. 27, formed in the main surface of a silicon substrate (not shown) is an n well region 24, within which p type MOS transistors (load transistors) Q3 and Q4 are formed. N type MOS transistors (driver transistors) Q1 and Q2 as well as n type MOS transistors (access transistors) Q5 and Q6 are formed outside n well region 24.

Access transistors Q5 and Q6 include $n^+$ impurity diffusion regions 1$a$1 and 1$b$1 as well as 1$a$2 and 1$b$2, respectively. A polysilicon layer 2$a$ functions as a gate for access transistors Q5 and Q6. Driver transistors Q1 and Q2 include $n^+$ impurity region regions 1$c$1 and 1$b$1 as well as 1$c$2 and 1$b$2, respectively. Further, load transistors Q3 and Q4 have $p^+$ impurity diffusion regions 8$a$1 and 8$b$1 as well as 8$a$2 and 8$b$2, respectively.

A polysilicon layer 2$b$1 functions as a gate for driver transistor Q1 and load transistor Q3, whereas a polysilicon layer 2$b$2 functions as a gate for driver transistor Q2 and load transistor Q4. Polysilicon layer 2$b$1 is electrically connected to $n^+$ impurity diffusion region 1$b$2 through a contact hole 3$d$2, while polysilicon layer 2$b$2 is connected to $p^+$ impurity diffusion region 8$b$1 through a contact hole 3$d$1. The connection corresponds to a storage node portion.

$N^+$ impurity diffusion regions 1$a$1 and 1$a$2 are connected to a bit line through contact holes 3$a$1 and 3$a$2. $N^+$ impurity diffusion regions 1$c$1 and 1$c$2 are connected to a ground line through contact holes 3$b$1 and 3$b$2. $P^+$ impurity diffusion regions 8$a$1 and 8$a$2 are connected to a power supply line through contact holes 3$c$1 and 3$c$2.

Referring now to FIG. 28, first metal interconnections 5$a$1, 5$a$2, 5$b$1, 5$b$2, 5$c$, 5$d$1 and 5$d$2 are formed on the structure shown in FIG. 27 with an insulation layer interposed. Second metal interconnections 7$a$1, 7$a$2, 7$b$1 and 7$b$2 are formed on these first metal interconnections with an insulation layer interposed. 7$a$1 and 7$a$2 as well as 7$b$1 and 7$b$2 correspond to the bit and ground lines, respectively.

First metal interconnections 5$a$1 and 5$a$2 are respectively connected to second metal interconnections 7$a$1 and 7$a$2 through via holes 6$a$1 and 6$a$2. First metal interconnection 5$b$1 is connected to second metal interconnection 7$b$1 through via hole 6$b$1, whereas second metal interconnection 5$b$2 is connected to second metal interconnection 7$b$2 through via hole 6$b$2.

First metal interconnection 5$d$1 is connected to $n^+$ and $p^+$ impurity diffusion regions 1$b$1 and 8$b$1 through contact holes 3$e$1 and 3$d$1, whereas first metal interconnection 5$d$2 is connected to $n^+$ and $p^+$ impurity diffusion regions 1$b$2 and 8$b$2 through contact holes 3$d$2 and 3$e$2. First metal interconnection 5$c$ is connected to $p^+$ impurity diffusion regions 8$a$1 and 8$a$2 through contact holes 3$c$1 and 3$c$2.

Referring now to FIG. 29, the cross sectional structure along line 29—29 in FIGS. 27 and 28 will be described. With reference to FIG. 29, n and p wells 24 and 25 are formed in the main surface of silicon substrate 11. Further, an isolation region 14 is selectively formed in the main surface of silicon substrate 11. $P^+$ impurity diffusion region 8$b$1 is formed in the surface of the n well, and $n^+$ impurity diffusion regions 1$a$1 an 1$b$1 are formed in the surface of the p well spaced apart from each other.

Polysilicon layers 2$a$ and 2$b$2 are formed on the main surface of silicon substrate 11 with gate insulation layers 16$a$ and 16$b$ interposed, respectively. Polysilicon layer 2$b$1 also extends over isolation region 14. An interlayer insulation layer 17$a$ is formed to cover polysilicon layers 2$a$, 2$b$1 and 2$b$2. Contact holes 3$a$1, 3$e$1 and 3$d$1 are formed in interlayer insulation layer 17$a$.

First metal interconnections 5$a$1 and 5$d$1 are formed on interlayer insulation layer 17$a$. An interlayer insulation layer 17$b$ is formed to cover first metal interconnections 5$a$1 and 5$d$1. Via hole 6$a$1 is formed in interlayer insulation layer 17$b$. Second metal interconnection 7$a$1 is formed on interlayer insulation layer 17$b$.

The conventional memory cell having the aforementioned structure is however encountered with the following problems. As shown in FIG. 29, a boundary of n and p wells 24 and 25 exists between the nMOS and pMOS transistors, and therefore the nMOS and pMOS transistors or the like must be formed a distance apart from the boundary, which disadvantageously increases the memory cell region.

In addition, as the nMOS and pMOS transistors must be formed a distance apart from the above mentioned boundary, the number of boundaries in the memory cell is desirably minimized. For this reason, MOS transistors of the same conductivity types are combined together as shown in FIG. 27. As a result, for example in the case shown in FIG. 27, an upper layer interconnection, such as first metal interconnection 5$d$1, for connecting $p^+$ impurity diffusion region 8$b$1 to $n^+$ impurity diffusion region 1$b$1 is required, thereby increasing the number of interconnections. Moreover, the disadvantageous increase in the number of interconnections results in a complicated interconnection structure.

SUMMARY OF THE INVENTION

The present invention is made to solve the above mentioned problems. It is an object of the present invention to provide a static semiconductor memory device which allows reduction in a memory cell region and simplification of an interconnection structure, as well as a manufacturing method thereof.

A static semiconductor memory device according to the present invention includes a so-called SOI (Semiconductor On Insulator) structure, which is formed in a semiconductor layer provided on a substrate with an insulation layer interposed. The static semiconductor memory device according to the present invention includes first and second inverters as well as first and second access transistors. The first inverter includes a first driver transistor having a pair of impurity diffusion regions of a first conductivity type, and a first load transistor having a pair of impurity diffusion regions of a second conductivity type. The second inverter includes a second driver transistor having a pair of impurity diffusion regions of the first conductivity type, and a second load transistor having a pair of impurity diffusion regions of the second conductivity type. Each of the first and second access transistors includes a pair of impurity diffusion regions of the first conductivity type. The gates of the first driver transistor and the first load transistor are integrated to form a first gate, while the gates of the second driver transistor and the second load transistor are integrated to form a second gate. A longitudinal end of the first gate extends in a first direction to be connected to one of the impurity diffusion regions of the first access transistor. A longitudinal end of the second gate extends in a second direction, opposite from the first direction, to be connected to one of the impurity diffusion regions of the second access transistor. Integrally connecting one of the impurity diffusion regions of the first driver transistor to one of the impurity diffusion regions of the first load transistor forms a first drain electrode of the first inverter. Integrally connecting one of the impurity diffusion regions of the second driver transistor to one of the impurity diffusion regions of the second load transistors form a second drain electrode of the second inverter.

As in the foregoing, the static semiconductor memory device according to the present invention has a so-called SOI structure, which is formed in the semiconductor layer provided on the substrate with an insulation layer interposed. Unlike the conventional example, each of MOS transistors of different conductivity types need not be provided with a well. The area in the vicinity of the boundary of wells between the MOS transistors of different conductivity types may be eliminated. The area for the memory cell can therefore be reduced. In addition, MOS transistors of different conductivity types can be alternately arranged without increasing the area for the memory cell. More specifically, a load transistor of the second conductivity type can be arranged between the driver and access transistors of the first conductivity type. The longitudinal ends of the first and second gates can therefore extend in opposite directions to be connected to one of the impurity diffusion regions of the first and second access transistors, respectively. As a result, polysilicon layers 2b1 and 2b2 corresponding to the first and second gates can be formed in straight shapes as shown for example in FIG. 1, so that the interconnection structure can be simplified as compared with the conventional example shown in FIG. 27 or the like. Further, as the well needs not be formed as mentioned above, integrally connecting one of the impurity diffusion regions of the driver transistor to one of the impurity diffusion regions of the load transistor can form a drain electrode. This is also contributable to the reduction in the area for the memory cell. In addition, the provision of the drain electrode elimi-nates an upper layer interconnection, for connecting one of the impurity diffusion regions of the driver transistor to one of the impurity diffusion regions of the load transistor. Therefore, the static semiconductor memory device having reduced area for the memory cell and a simplified interconnection structure can be achieved.

The above mentioned first drain electrode may include a first silicide layer integrally formed by silicidizing (turning to silicide) the surface of one of the impurity diffusion region of the first driver transistor and the surface of one of the impurity diffusion region of the first load transistor and electrically connecting them. The second drain electrode may include a second silicide layer integrally formed by silicidizing the surface of one of the impurity diffusion region of the second driver transistor and the surface of one of the impurity diffusion region of the second load transistor and electrically connecting them.

The provision of the above mentioned first and second silicide layers can cause electrical short between one of the impurity diffusion regions of the first and second driver transistors and one of the impurity diffusion regions of the first and second load transistors. This eliminates the upper interconnection for connecting therebetween. The number of upper interconnections can be thus reduced, contributively simplifying the interconnection structure. It is also contributable to the planarization of the static semiconductor memory device as the first and second silicide layers are formed by silicidizing the surfaces of the impurity diffusion regions.

Third and fourth silicide layers may be formed in the surfaces of one of the impurity diffusion regions of the first and second access transistors. In this case, the third silicide layer may extend on the sidewall and the top surface of the first gate, whereas the fourth silicide layer may extend on the sidewall and the top surface of the second gate.

The extension of the third and fourth silicide layers on the sidewalls and the top surfaces of the first and second gates enables reduction in the resistance value for the first and second gate as well as in the contact resistance between the first and second gates and the impurity diffusion region.

The above mentioned first and second driver transistors are connected to a ground line through first and second contact holes, respectively. The first and second load transistors are connected to a power supply line through third and fourth contact holes, respectively. The third and fourth contact holes are preferably formed on the same side with respect to an imaginary segment between the first and second contact holes.

The imaginary segment between the first and second contact holes and that between the third and fourth contact holes intersect when the third and fourth contact holes are not formed on the same side with respect to the imaginary segment between the first and second contact holes. As a result, in connecting the first and second contact holes with a single ground line, and also the third and fourth contact holes with a single power supply line, the ground line and power supply line intersect. The number of ground lines or power supply lines must be therefore increased. On the other hand, forming the third and fourth contact holes on the same side with respect to the imaginary segment between the first and second contact holes can prevent the intersection of the ground line and the power supply line. Thus, the increase in the number of ground lines or power supply lines can be prevented, contributively simplifying the interconnection structure.

The above mentioned static semiconductor memory device preferably includes first and second active regions in straight shapes. The pair of the impurity diffusion regions of the first driver transistor as well as the pair of the impurity diffusion regions of the second access transistors are formed in the first active region, whereas the pair of the impurity diffusion regions of the second driver transistor and the pair of the impurity diffusion regions of the first access transistor are formed in a second active region. Further, the pair of the impurity diffusion regions of the first load transistor extends in the direction which intersects with the longitudinal direction of the first active region, while the pair of the impurity diffusion regions of the second load transistor extends in a direction which intersects with the longitudinal direction of the second active region.

The straight shapes of the first and second active regions can simplify the pattern of the field of the memory cell in the static semiconductor memory device. As a result, photolithography is facilitated and the pattern of the field can be finished in a suitable shape.

In a method of manufacturing a static semiconductor memory device according to the present invention, the static semiconductor memory device includes a first gate which is integrally formed by a gate of a driver transistor of a first conductivity type and a gate of a load transistor of a second conductivity type, and a second gate which is to be the gate of an access transistor of the first conductivity type. In one aspect of the present invention, the method includes the following steps. A substrate is prepared which has a semiconductor layer formed on the main surface with an insulation layer interposed. In other words, an SOI substrate is provided. An isolation region is selectively formed in the semiconductor layer. A gate insulation layer with an opening is formed on an active region which is surrounded by the isolation region. The first gate is formed on the gate insulation layer such that one end thereof is connected to the active region through the opening, and the second gate is also formed on the gate insulation layer. Sidewall insulation layers are formed on sidewalls of the first and second gates. Impurities of the first and second conductivity types are selectively implanted into the active region using the first and second gates and the sidewall insulation layers as masks, so as to form a first impurity diffusion region of the first conductivity type for the driver transistor and a second impurity diffusion region of the second conductivity type for the load transistor in contact with each other. A silicide layer for electrically connecting the first and second impurity diffusion regions is formed by silicidation of the surfaces of the first and second impurity diffusion regions.

As the first and second impurity diffusion regions are formed in contact with each other by selectively implanting the impurities of the first and second conductivity types into the active region, the area for the memory cell can be reduced as compared with the conventional example. In addition, the first and second impurity diffusion regions are electrically connected by silicidation of the surfaces of the first and second impurity diffusion regions, so that a process per se as well as the interconnection structure can be simplified, as compared with the case in which the first and second impurity diffusion regions are connected by an upper layer interconnection.

In another aspect of the method of manufacturing a static semiconductor memory device according to the present invention, the following steps are provided. A substrate is prepared which has a semiconductor layer formed on the main surface with an insulation layer interposed. An isolation region is selectively formed in the semiconductor layer. First and second gates are formed on an active region surrounded by the isolation region with a gate insulation layer interposed. Sidewall insulation layers are formed on sidewalls of the first and second gates. Impurities of first and second conductivity types are selectively implanted into the active region using the first and second gates and the sidewall insulation layers as masks, so as to form a first impurity diffusion region of the first conductivity type for a driver transistor and a second impurity diffusion region of the second conductivity type for a load transistor in contact with each other, and further a third impurity diffusion region of the first conductivity type for an access transistor. The sidewall insulation layer for the first gate positioned on the third impurity diffusion region is removed. Silicidation of the surfaces of the first and second gates as well as those of the first, second and third impurity diffusion regions forms a first silicide layer electrically connecting the first and second impurity diffusion regions and a second silicide layer electrically connecting the third impurity diffusion region and the first gate.

As mentioned above, in another aspect, the first and second silicide layers are formed after selectively removing the sidewall insulation layer for the first gate. This makes it possible to electrically connect the first and second impurity diffusion regions by the first silicide layer as well as the third impurity diffusion region and the first gate by the second silicide layers, respectively. As a result, reduction in the contact resistance between the third impurity diffusion region and the first gate, in addition to the similar effects as in the above mentioned one aspect, can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
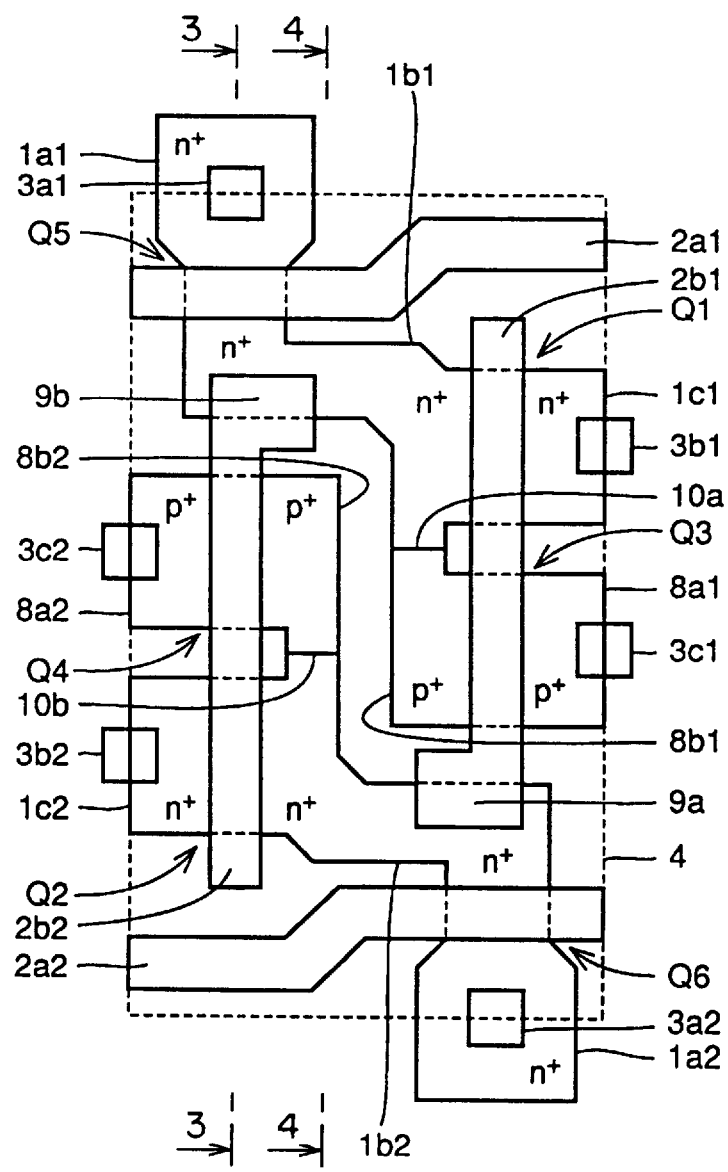
FIG. 1 is a plan view showing a lower layer portion of a memory cell region in a static semiconductor memory device in accordance with a first embodiment of the present invention.
Figure 2:
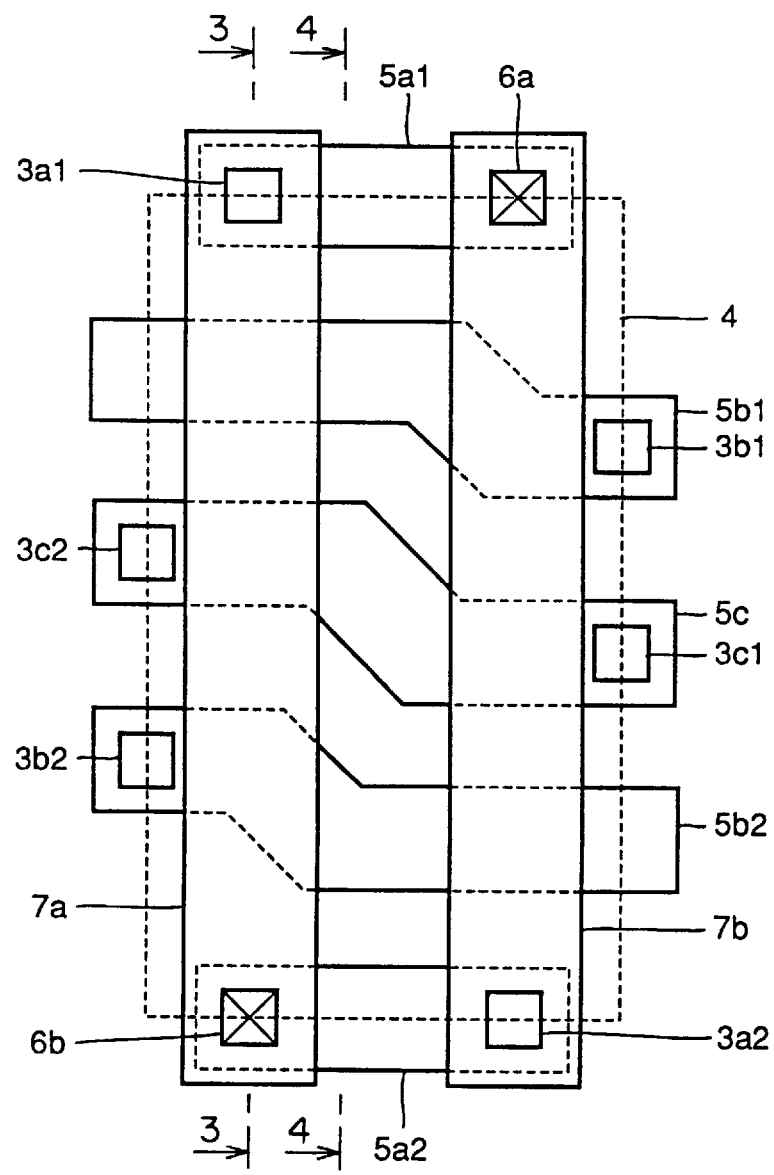
FIG. 2 is a plan view showing an upper layer portion of the memory cell region in the static semiconductor memory device in accordance with the first embodiment of the present invention.
Figure 3:
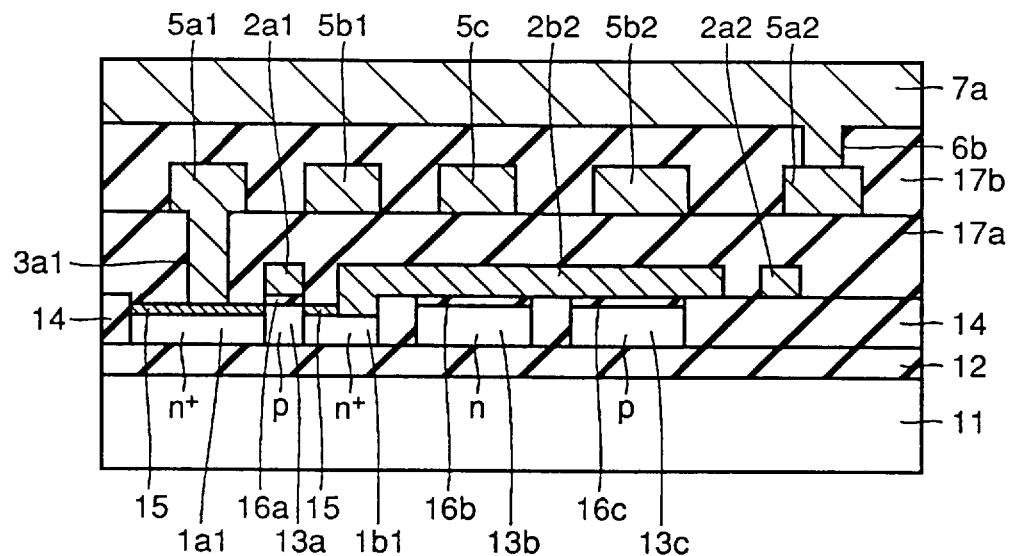
FIGS. 3 and 4 are cross sectional views taken along lines 3—3 and 4—4 in FIGS. 1 and 2, respectively.
Figure 4:
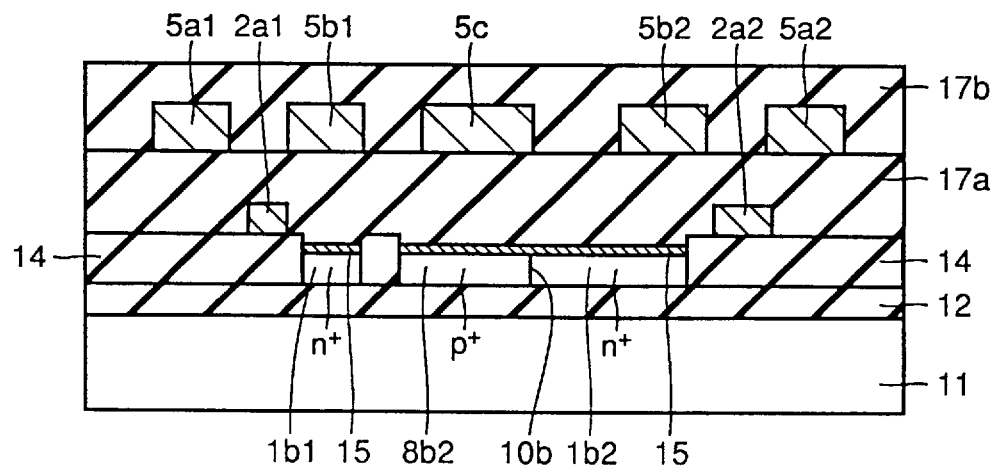

The embodiments of the present invention will now be described with reference to FIGS. 1 to 25.
First Embodiment Referring now to FIGS. 1 to 17, a first embodiment of the present invention and a modification thereof will be described. FIGS. 1 and 2 are plan views each showing a memory cell for one bit in a static semiconductor memory device in accordance with the first embodiment of the present invention. FIGS. 3 and 4 are views showing cross sectional structures respectively taken along lines 3—3 and 4—4 in FIGS. 1 and 2. The memory cells are two-dimensionally arranged in a symmetrically folded manner along each side of memory cell region 4 to form a memory array.

With reference to FIG. 1, six MOS transistors are formed in memory cell region 4. NMOS transistors (driver transistors) Q1 and Q2 include $n^+$ impurity diffusion regions 1b1 and 1c1 as well as 1b2 and 1c2, respectively. PMOS transistors (load transistors) Q3 and Q4 include $p^+$ impurity diffusion regions 8a1 and 8b1 as well as 8a2 and 8b2, respectively.

A polysilicon layer (a first gate) 2b1 having a straight shape is formed which functions as a gate for driver and load transistors Q1 and Q3. A polysilicon layer (a second gate) 2b2 having a straight shape is formed which functions as a gate for driver and load transistors Q2 and Q4.

NMOS transistors (access transistors) Q5 and Q6 include $n^+$ impurity diffusion regions 1a1 and 1b1 as well as 1a2 and 1b2, respectively. Polysilicon layers 2a1 and 2a2 respectively function as gates for access transistors Q5 and Q6. Polysilicon layers 2a1 and 2a2 are word lines, so that the static semiconductor memory device in accordance with the present embodiment will have so-called split word lines.

As shown in FIG. 1, load transistor Q3 is positioned between driver and access transistors Q1 and Q6, while load transistor Q4 is positioned between driver and access transistors Q2 and Q5. The alternate arrangement of MOS transistors of different conductivity types can make polysilicon layers 2b1 and 2b2 in straight shapes. The interconnection structure is therefore simplified as compared with the conventional example. Furthermore, the straight extension of a longitudinal end of polysilicon layer 2b1 allows polysilicon layer 2b1 to be connected to $n^+$ impurity diffusion region 1b2 of access transistor Q6 through a contact portion 9a. Meanwhile, the straight extension of polysilicon layer 2b2 in a direction which is opposite from that in which polysilicon layer 2b1 extends allows polysilicon layer 2b2 to be connected to $n^+$ impurity diffusion region 1b1 of access transistor Q5 through a contact portion 9b.

Further, $p^+$ impurity diffusion region 8b1 and $n^+$ impurity diffusion region 1b1 are integrally connected through a junction 10a. $P^+$ impurity diffusion region 8b2 and $n^+$ impurity diffusion region 1b2 are also integrally connected through a junction 10b.

Driver and load transistors Q1 and Q3 form a first inverter, whereas driver and load transistors Q2 and Q4 form a second inverter. The above mentioned connection of $n^+$ and $p^+$ impurity diffusion regions 1b1 and 8b1 forms a drain electrode for the first inverter by the integrated impurity diffusion regions. In addition, the connection of $p^+$ and $n^+$ impurity diffusion regions 8b2 and 1b2 forms a drain electrode for the second inverter by the integrated impurity diffusion regions.

Referring now to FIG. 2, first metal interconnections 5a1, 5a2, 5b1, 5b2 and 5c are formed above memory cell region 4. Second metal interconnections 7a and 7b are further formed thereabove.

First metal interconnection 5a1 is connected to $n^+$ impurity diffusion region 1a1 and second metal interconnection 7b through a contact hole 3a1 and a via hole 6a, respectively. First metal interconnection 5a2 is connected to $n^+$ impurity diffusion region 1a2 and second metal interconnection 7b through a contact hole 3a2 and a via hole 6b, respectively. The second metal interconnections 7a and 7b are bit lines.

First metal interconnections 5b1 and 5b2 are connected to $n^+$ impurity diffusion regions 1c1 and 1c2 through contact holes 3b1 and 3b2, respectively. First metal interconnections 5b1 and 5b2 are ground lines. First metal interconnection 5c is connected to $p^+$ impurity diffusion regions 8a1 and 8a2 through contact holes 3c1 and 3c2, respectively. The first metal interconnection 5c is a power supply line.

Referring now to FIGS. 3 and 4, a cross sectional structure of the memory cell region shown in FIGS. 1 and 2 will be described.

As shown in FIG. 3, an isolation region 14 is selectively formed in a semiconductor layer, which is provided on the main surface of a silicon substrate 11 with a buried insulation layer 12 formed of silicon oxide or the like interposed. The region surrounded by isolation region 14 is an active region. As described above, formed in the active region are $n^+$ impurity diffusion regions 1a1 and 1b1 or the like, having high concentration, and channel doped regions 13a, 13b and 13c or the like are in turn formed therebetween. A silicide layer 15 is formed on a surface of $n^+$ impurity diffusion regions 1a1 and 1b. Then, selectively removing silicide layer 15 directly connects one end of polysilicon layer 2b2 to $n^+$ impurity diffusion region 1b1. It is noted that polysilicon layer 2b2 may be connected to $n^+$ impurity diffusion region 1b1 with silicide layer 15 interposed.

An interlayer insulation layer 17a is formed to cover polysilicon layers 2a1, 2b2 and 2a2. First metal interconnections 5a1, 5b1, 5c, 5b2 and 5a2 are formed on interlayer insulation layer 17a. An interlayer insulation layer 17b is formed to cover first metal interconnections 5a1, 5b1, 5c, 5b2 and 5a2. Second metal interconnection 7a is formed on interlayer insulation layer 17b. Second metal interconnection 7a is connected to first metal interconnection 5a2 through via hole 6b, and first metal interconnection 5a1 is connected to n⁺ impurity diffusion region 1a1 through a contact hole 3a1.

With reference now to FIG. 4, p⁺ and n⁺ impurity diffusion regions 8b2 and 1b2 are integrally connected through a junction 10b. When p⁺ and n⁺ impurity diffusion regions 8b2 and 1b2 are thus connected, a diode is normally formed at the junction 10b. An ohmic (resistive) connection is not therefore obtained. To solve this problem, the present embodiment forms silicide layer 15 which connects the surfaces of p⁺ and n⁺ impurity diffusion regions 8b2 and 1b2 by silicidizing them. The formation of silicide layer 15 can make p⁺ and n⁺ impurity diffusion regions 8b2 and 1b2 short circuited for electrical connection. Thus, an interconnection layer for connecting p⁺ and n⁺ impurity diffusion regions 8b2 and 1b2 need not be further formed in an upper layer, so that the number of interconnection layers can be decreased as compared with the conventional example. As a result, the interconnection structure is simplified as compared with the conventional example. In addition, silicide layer 15 is formed silicidizing the surfaces of p⁺ and n⁺ impurity diffusion regions 8b2 and 1b2, contributively planarizing memory cell region 4.

As shown in FIGS. 3 and 4, the static semiconductor memory device according to the present invention has an SOI structure, eliminating a p well for forming an nMOS transistor or an n well for a pMOS transistor. A boundary of wells is not therefore formed between nMOS and pMOS transistors, effectively preventing the increase in the area for memory cell region 4 due to the region in the vicinity of the boundary of wells.

Figure 5:
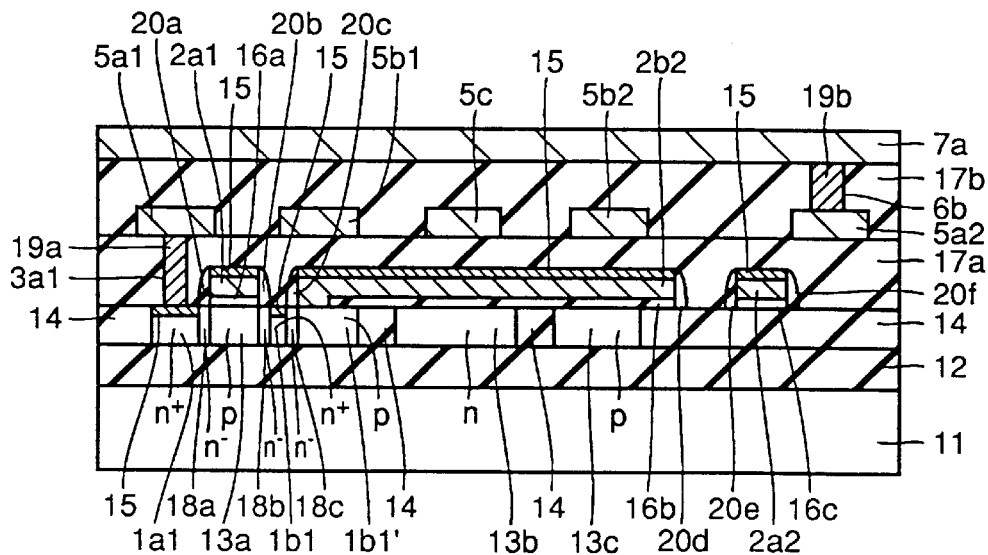
FIG. 5 is a cross sectional view showing a modification of the cross sectional structure shown in FIG. 3.

Referring now to FIGS. 5 to 17, a modification of the structure shown in FIG. 3 will be described. As shown in FIG. 5, in the present modification, a silicide layer 15 is formed by silicidizing the surfaces of polysilicon layers 2a1, 2b2 and 2a2. Further, sidewall insulation layers 20a, 20b, 20c, 20d, 20e and 20f are formed on the sidewalls of polysilicon layers 2a1, 2a2 and 2b2.

In addition, each MOS transistor formed in memory cell region 4 has an LDD (Lightly Doped Drain) structure. With reference to the cross section shown in FIG. 5, n⁻ impurity diffusion regions 18a, 18b and 18c are formed adjacent to n⁺ impurity diffusion regions 1a1 and 1b1, while p type impurity diffusion region 1b1' is formed adjacent to an n⁻ impurity diffusion region 18c. In the present modification, plugs 19a and 19b are respectively formed in a contact hole 3a1 and a via hole 6b. The other structure are almost the same as those shown in FIG. 3. It is noted that the characteristics of the structure shown in FIG. 5 can be applied to the second to fourth embodiments, which will be later described.

Resistance values for polysilicon layers 2a1, 2a2 and 2b2 can be decreased by silicidizing the surfaces thereof as mentioned above. Also, formation of the above mentioned sidewall insulation layers 20a to 20f ensures that silicide layer 15 formed on the surfaces of polysilicon layers 2a1, 2a2 and 2b2 is separated from that formed on the surface of the impurity diffusion region having high concentration such as n⁺ impurity diffusion regions 1a1 and 1b1. As a result, the static semiconductor memory device with high performance and reliability can be obtained.

Referring now to FIGS. 6 to 14, a method of manufacturing the static semiconductor memory device having the structure shown in FIG. 5 will be described.

Figure 6:
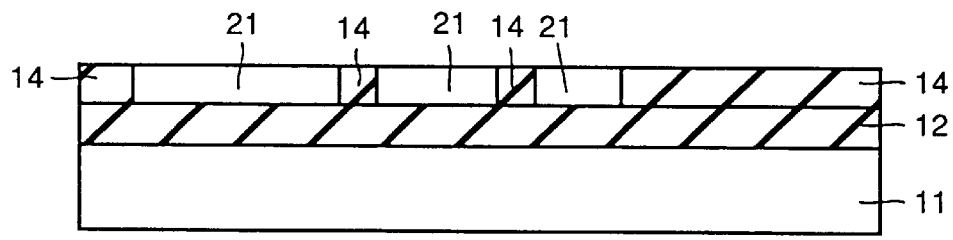
FIGS. 6 to 11 are cross sectional views showing the first to sixth steps of a process of manufacturing the structure shown in FIG. 5.

With reference firstly to FIG. 6, an SOI substrate is provided which has a semiconductor layer (a thin film silicon layer) 21 formed on the main surface of a silicon substrate 11 with a buried insulation layer 12 interposed. An isolation region is selectively formed in thin film silicon layer 21. In a method of forming isolation region 14, for example, thin film silicon layer 21 is selectively removed to form a trench, in which an insulation layer such as a silicon oxide is buried.

Figure 7:
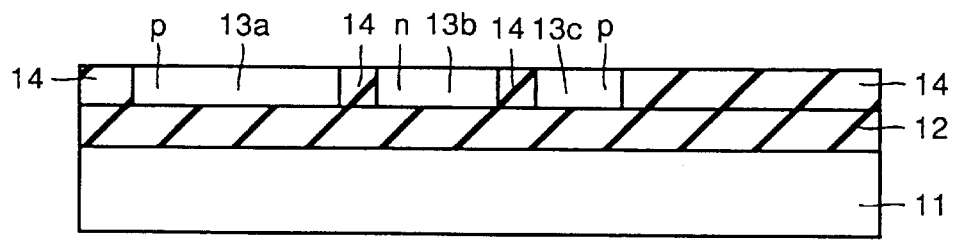

With reference now to FIG. 7, p type and n type impurities are selectively implanted into thin film silicon layer 21, which is surrounded by isolation region 14 and functions as an active region. Channel implantation for pMOS and nMOS transistors are thus performed.

Figure 8:
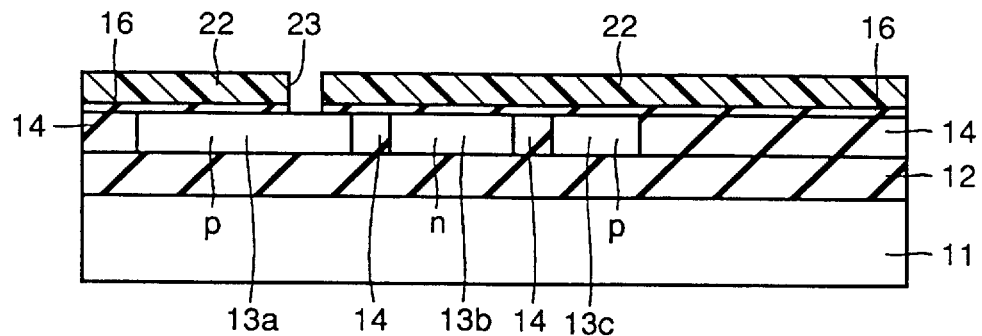

Referring now to FIG. 8, a gate insulation layer 16 is formed on the surface of thin film silicon layer 21, and resist 22 is applied thereon. An opening 23 is formed in resist 22 at the portion located on the contact portion of the inverter gate (polysilicon layer 2b2) and the impurity diffusion region. Subsequently, the surface of thin film silicon layer 21 is selectively exposed by etching gate insulation layer 16 using resist 22 as a mask.

Figure 9:
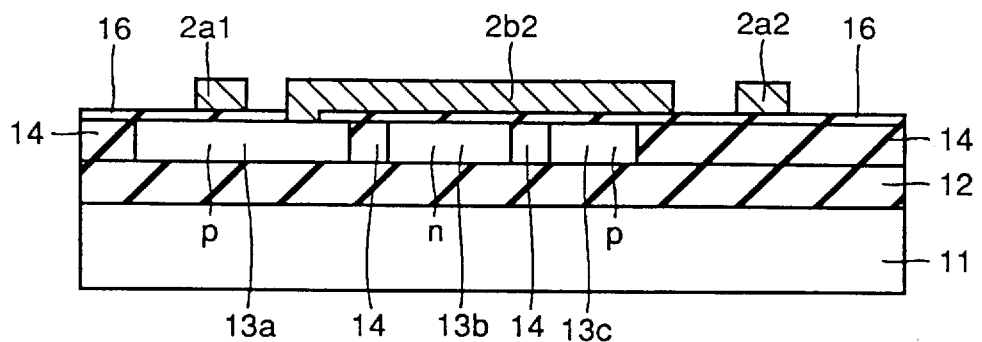

As shown in FIG. 9, a polysilicon layer is now deposited by means of CVD or the like, which is then patterned in a prescribed shape. Polysilicon layers 2a1, 2a2 and 2b2 are thereby formed. One end of polysilicon layer 2b2 is in contact with the impurity diffusion region. Further, polysilicon layers 2a1 and 2a2 function as word lines, and polysilicon layer 2b2 as an inverter gate (a second gate).

Figure 10:
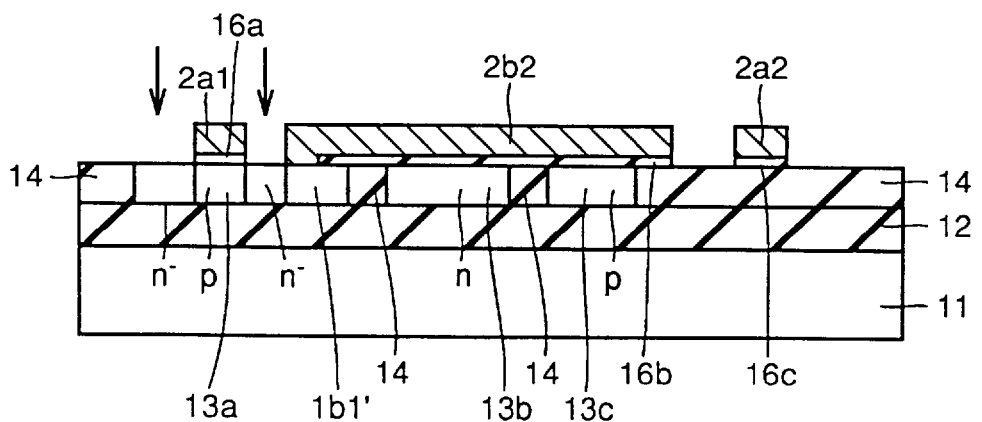

As shown in FIG. 10, an n type impurity is implanted into thin film silicon layer 21 using polysilicon layer 2a1 as a mask. An n⁻ impurity diffusion region is thereby formed. It is noted that a p⁻ impurity diffusion region is similarly formed for the pMOS transistor.

Figure 11:
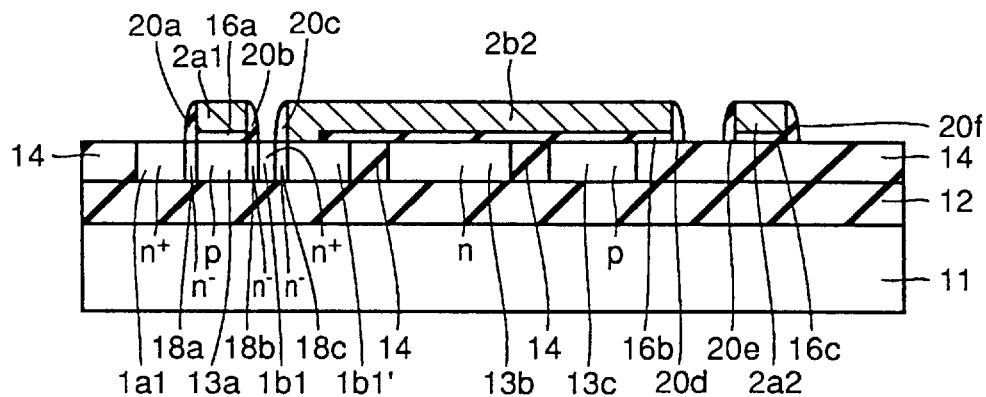

Next, as shown in FIG. 11, sidewall insulation layers 20a, 20b, 20c, 20d, 20e and 20f are formed on the sidewalls of polysilicon layers 2a1, 2a2 and 2b2. Using these sidewall insulation layers 20a to 20f and polysilicon layers 2a1, 2a2 and 2b2 as masks, the n type and p type impurities are selectively implanted in the prescribed region of thin film silicon layer 21. An n⁺ impurity diffusion regions 1a1 and 1b1 are thus formed. It is noted that the impurity diffusion region with high concentration for the pMOS transistor is also formed in this stage of manufacturing, although not shown in the drawings.

Figure 12A:
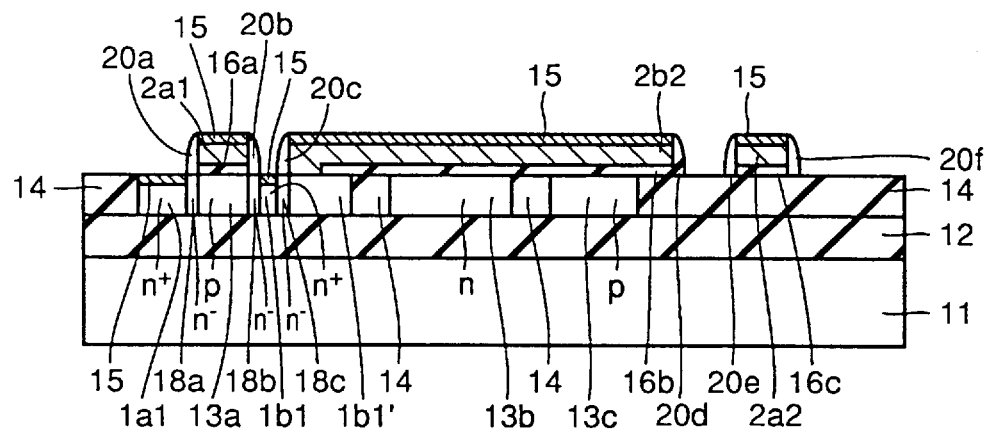
FIGS. 12A and 12B are cross sectional views showing the seventh step of the process of manufacturing the structure shown in FIG. 5.
Figure 12B:
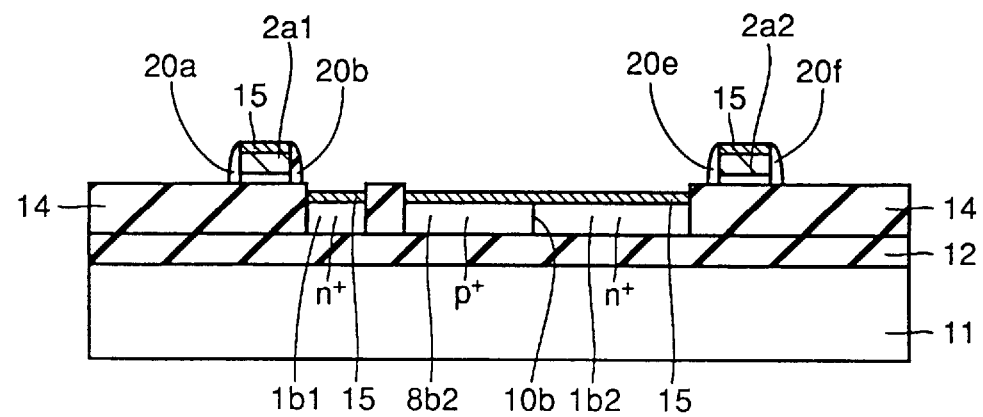

With reference now to FIGS. 12A and 12B, metal having a high melting point, such as Co, is deposited by means of sputtering or the like, followed by lamp annealing. Thus, silicide layer 15 is formed on the surface of the impurity diffusion region as well as on the surfaces of polysilicon layers 2a1, 2a2, 2b2 or the like. Formation of every silicide layer 15 in memory cell region 4, including those not shown in the drawings, is completed through this step. As shown in FIG. 12B, the electrical connection by silicide layer between p⁺ and n⁺ impurity diffusion regions 8b2 and 1b2, which are in contact with each other, eliminates an upper layer interconnection for connecting them. The interconnection structure as well as the process per se can therefore be simplified.

Figure 13:
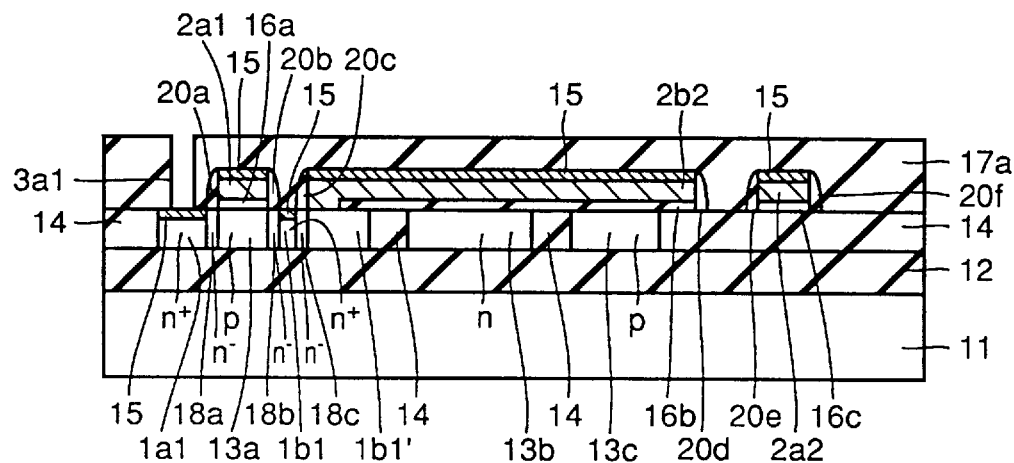
FIGS. 13 and 14 are cross sectional views showing the eighth and ninth steps of the process of manufacturing the structure shown in FIG. 5.

With reference now to FIG. 13, an interlayer insulation layer is deposited to cover polysilicon layers 2a1, 2a2, and 2b2, followed by planarization by means of heat treatment or CMP (Chemical Mechanical Polishing). A contact hole 3a1 is then formed in interlayer insulation layer 17a.

Figure 14:
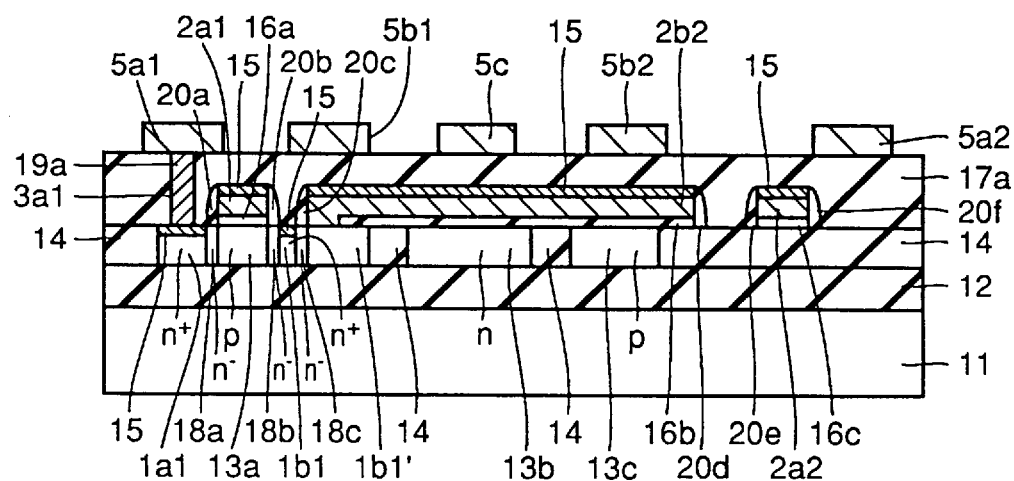

As shown in FIG. 14, a plug 19 is formed in contact hole 3a1, followed by formation of a metal layer on interlayer insulation layer 17a. Patterning the metal layer forms first metal interconnections 5a1, 5a2, 5b1, 5b2 and 5c.

Then, interlayer insulation layer 17b is deposited by a plasma method or the like, and a via hole 6b is formed therein. A plug 19b is formed in via hole 6b, and a metal layer is formed on plug 19b and interlayer insulation layer 17b by means of sputtering or the like. Patterning the metal layer forms a second metal interconnection 7a. Undergoing the above described steps completes the memory cell in the static semiconductor memory device shown in FIG. 5.

Figure 15:
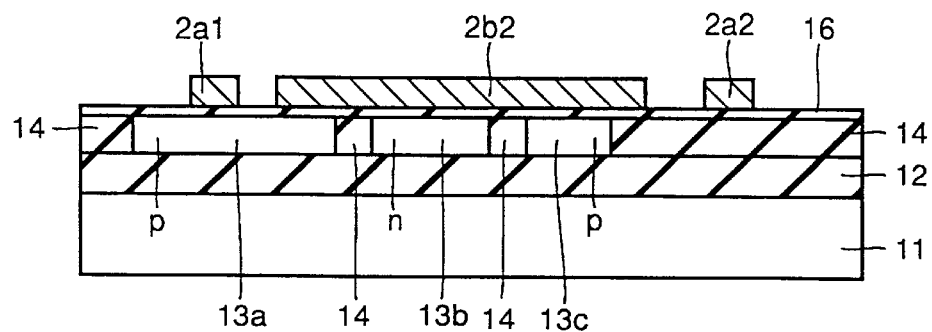
FIGS. 15 to 17 are cross sectional views showing the characteristic first to third steps of a process of manufacturing another modification of the structure shown in FIG. 3.
Figure 16:
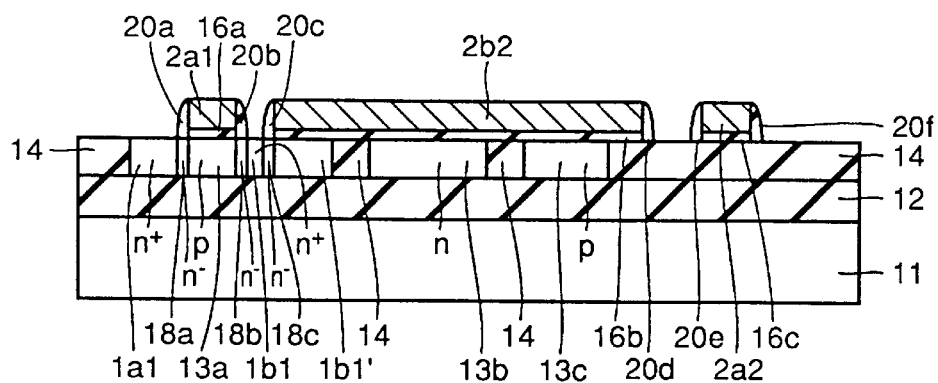
Figure 17:
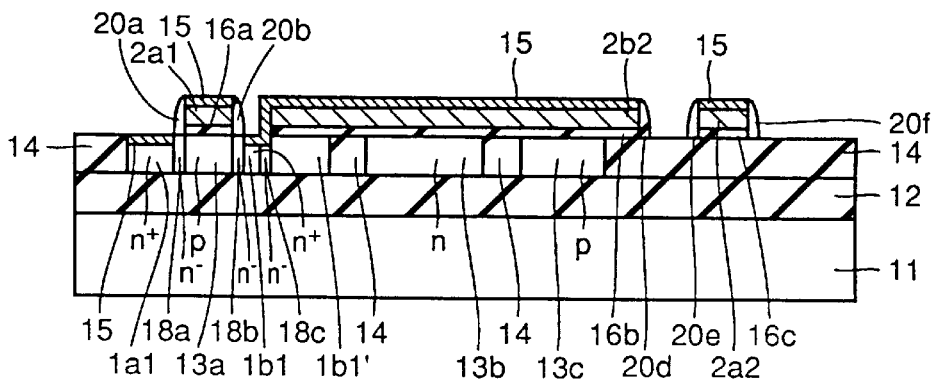

With reference to FIGS. 15 to 17, a further modification of the structure shown in FIG. 5 will now be described. In the present modification, as shown in FIG. 17, silicide layer 15 extends on the sidewall and the top surface of polysilicon layer 2b2. The other parts of the structure are almost the same as those shown in FIG. 5.

With reference to FIG. 15, the similar steps to those for the above-described manufacturing method, up to channel implantation shown in FIG. 7, are undergone. A gate insulation layer 16 is then formed on the entire surface, and a polysilicon layer is deposited thereon. Patterning the polysilicon layer forms polysilicon layers 2a1, 2a2 and 2b2.

As shown in FIG. 16, gate insulation layer 16 is patterned using polysilicon layers 2a1, 2a2 and 2b2 as masks, then $n^-$ impurity diffusion regions 18a, 18b and 18c are formed. Sidewall insulation layers 20a to 20f are formed on the sidewalls of polysilicon layers 2a1, 2a2 and 2b2, and diffusion regions with high impurity concentration, such as $n^+$ impurity diffusion regions 1a1 and 1b1, are formed in a method similar to the above described manufacturing method.

Referring now to FIG. 17, sidewall insulation layer 20c formed on the sidewall of polysilicon layer 2b2 is removed. More specifically, only a portion of the sidewall insulation layer formed on the sidewall of polysilicon layer 2b2, which is located around the contact portion of polysilicon layer 2b2 and p type impurity diffusion region 1b1', is selectively removed. A silicide layer 15 is then formed in a method similar to the above described manufacturing method. As a result, silicide layer 15 is formed to extend on the surface of $n^+$ impurity diffusion region 1b1 to the sidewall and the top surface of polysilicon layer 2b2. Silicide layer 15 thus connects $n^+$ impurity diffusion region 1b1 and polysilicon layer 2b2, allowing the contact resistance between p type impurity diffusion region 1b1' and polysilicon layer 2b2 to be further reduced than in the case shown in FIG. 5.

Second Embodiment

Figure 18:
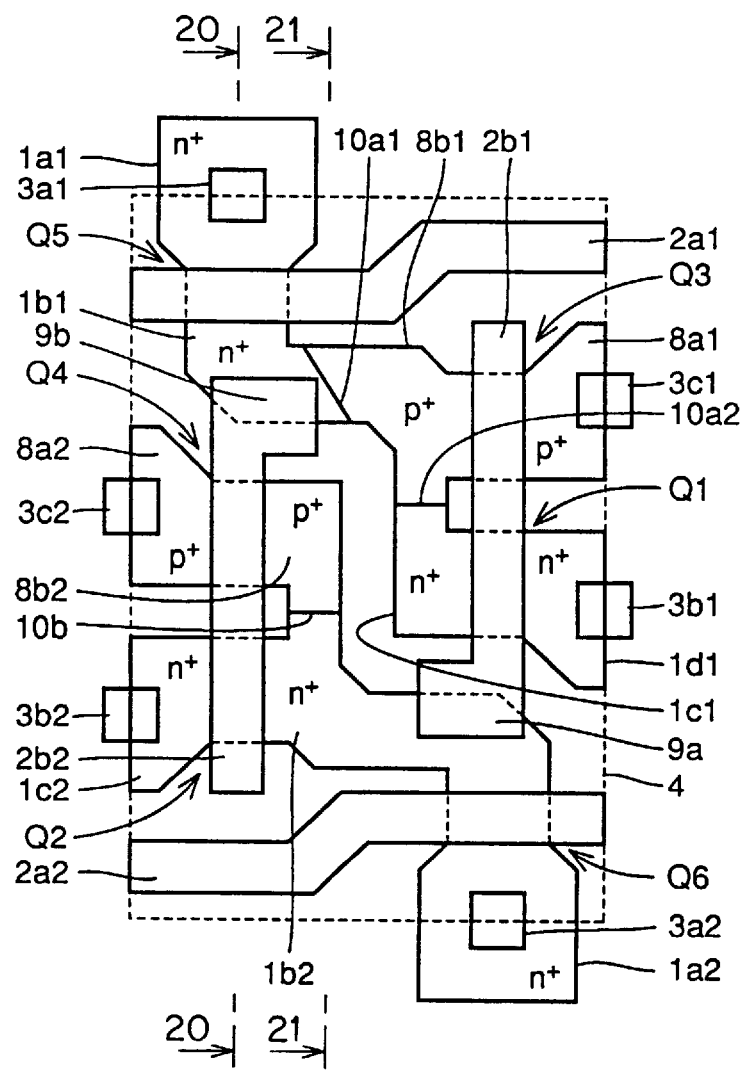
FIG. 18 is a plan view showing a lower layer portion of a memory cell region in a static semiconductor memory device in accordance with a second embodiment of the present invention.
Figure 19:
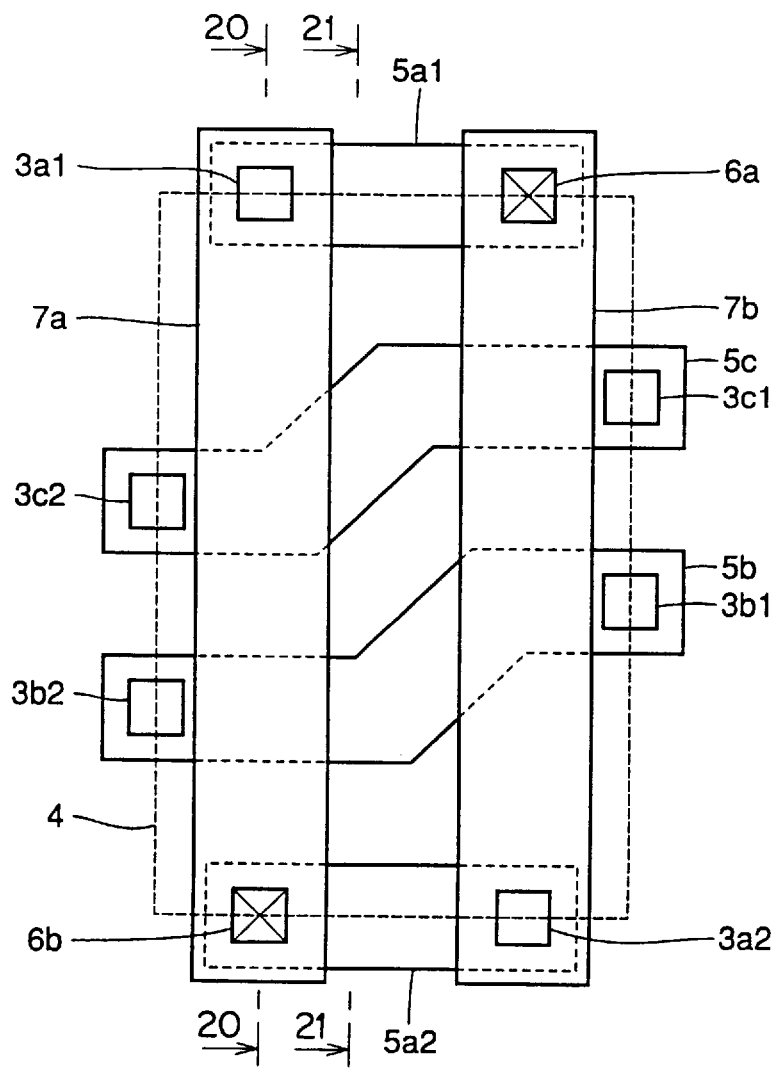
FIG. 19 is a plan view showing an upper layer portion of the memory cell region in the static semiconductor memory device in accordance with the second embodiment of the present invention.
Figure 20:
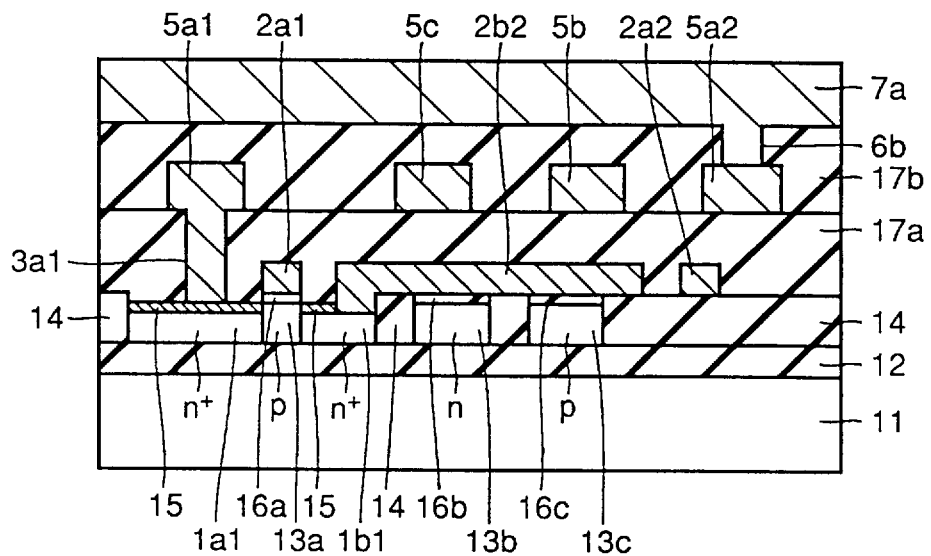
FIGS. 20 and 21 are cross sectional views taken along lines 20—20 and 21—21 in FIGS. 18 and 19, respectively.
Figure 21:
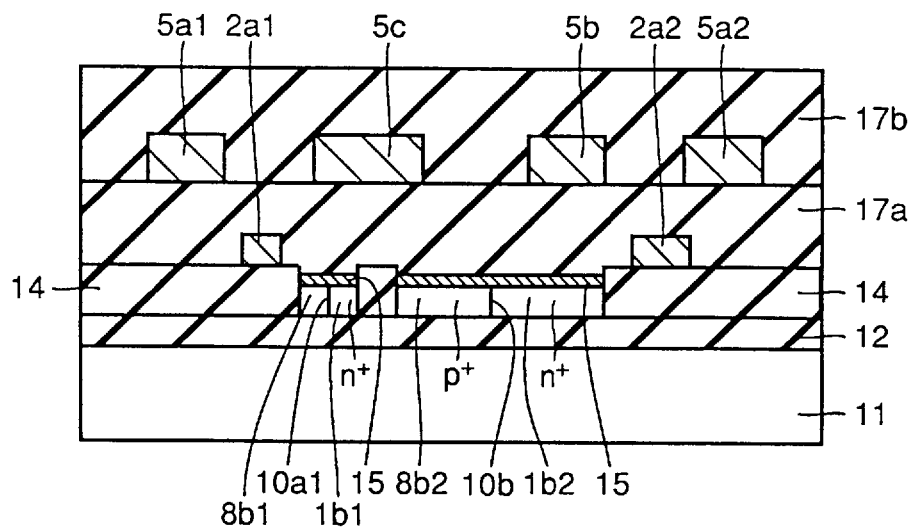

With reference to FIGS. 18 to 21, a second embodiment of the present invention will now be described. FIGS. 18 and 19 are plan views showing a memory cell region 4 in a static semiconductor memory device in accordance with the second embodiment of the present invention. FIGS. 20 and 21 are cross sectional views taken along lines 20—20 and 21—21 shown in FIGS. 18 and 19, respectively.

Referring to FIG. 18, in the present embodiment, a driver transistor Q1 and a load transistor Q3 are reversely positioned with respect to the first embodiment shown in FIG. 1. Junctions 10a1 and 10a2 are therefore formed on either side of $p^+$ impurity diffusion region 8b1.

Positioning driver transistors Q1 and Q2 as well as load transistors Q3 and Q4 as shown in FIG. 18 allows contact holes 3c1 and 3c2 to be positioned on the same side with respect to an imaginary segment between contact holes 3b1 and 3b2. Thus, contact holes 3b1 and 3b2 can be connected by a single first metal interconnection 5b as shown in FIG. 19. As a result, the number of first metal interconnections can be reduced as compared with the first embodiment shown in FIG. 2. The interconnection structure is further simplified as compared with first embodiment, contributively reducing the area for the memory cell region 4. Other parts of the structure are almost the same as those for the above described first embodiment.

Referring now to FIG. 20, it can be seen that the number of first metal interconnections 5a1, 5a2, 5b and 5c is smaller by one than in the case of the first embodiment shown in FIG. 3. Other parts of the structure are almost the same as those shown in FIG. 3.

Referring now to FIG. 21, $p^+$ and $n^+$ impurity diffusion regions 8b1 and 1b1 are connected through a junction 10a1. Other parts of the structure are almost the same as those for the first embodiment shown in FIG. 4.

Third Embodiment

Figure 22:
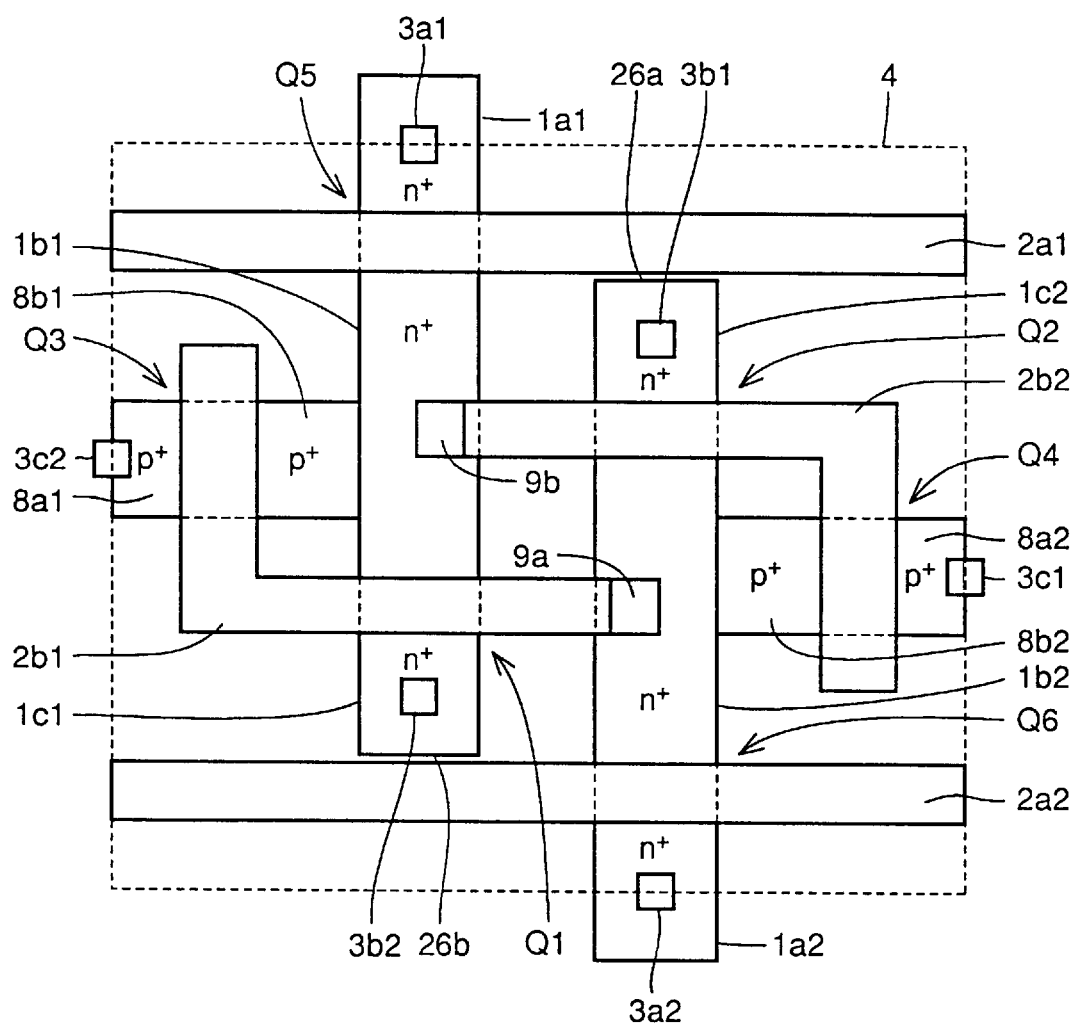
FIG. 22 is a plan view showing a lower portion of a memory cell region in a static semiconductor memory device in accordance with a third embodiment of the present invention.
Figure 23:
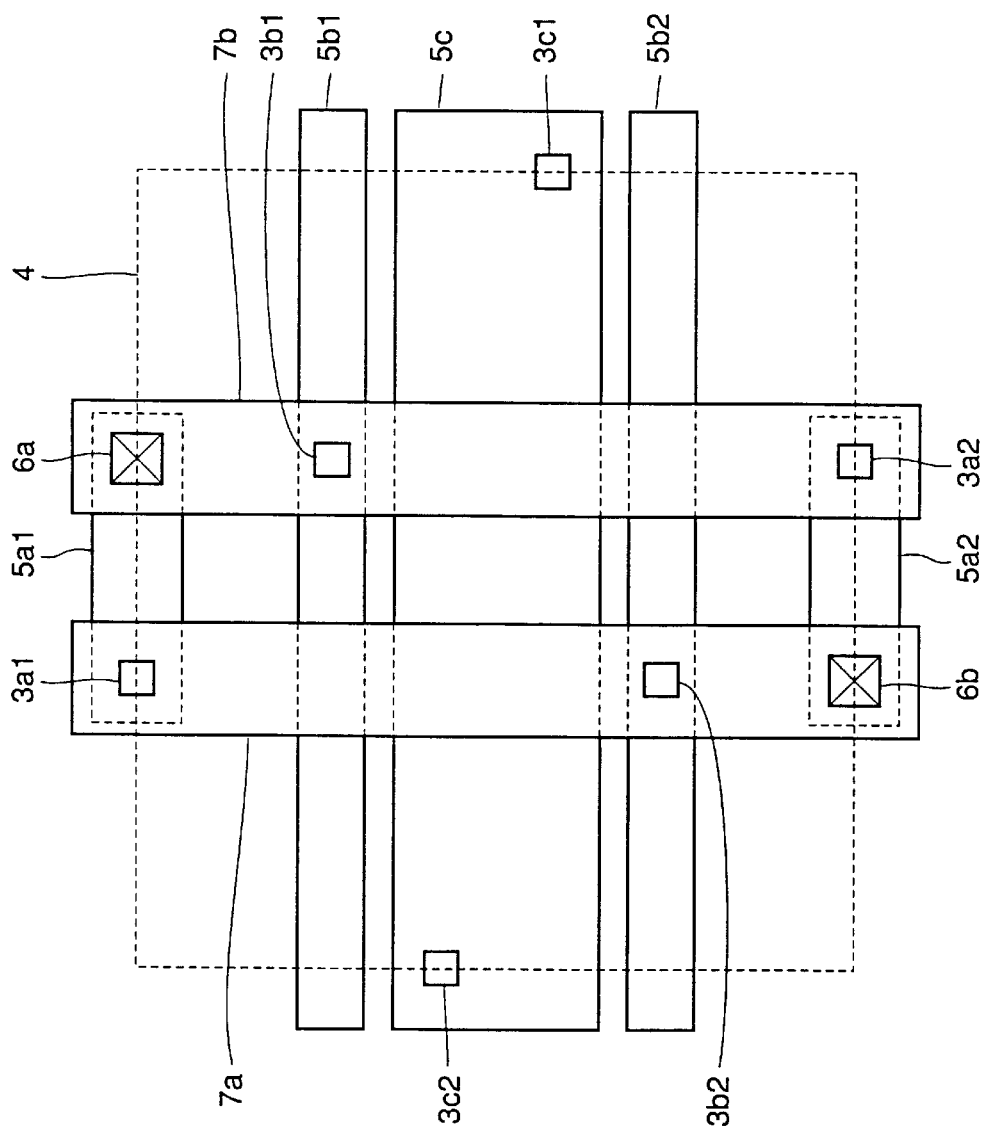
FIG. 23 is a plan view showing an upper layer portion of the memory cell region in the static semiconductor memory device in accordance with the third embodiment of the present invention.

With reference to FIGS. 22 and 23, a third embodiment of the present invention will now be described. FIGS. 22 and 23 are plan views of a memory cell region 4 in a static semiconductor memory device in accordance with the present embodiment.

Referring to FIG. 22, in the present embodiment, first and second active regions 26a and 26b having straight shapes are formed. $P^+$ impurity diffusion regions 8a1, 8a2, 8b1 and 8b2 for load transistors Q3 and Q4 extend in a direction which intersect with a longitudinal direction of the first and second active regions 26a and 26b. The third embodiment is made to bend polysilicon layers 2b1 and 2b2 so as to form the above mentioned first and second active regions 26a and 26b with straight shapes. More specifically, polysilicon layers 2b1 and 2b2 are bent approximately at right angles. By forming first and second active regions 26a and 26b in straight shapes as mentioned above, as well as by positioning $p^+$ impurity diffusion regions 8a1, 8a2, 8b1, and 8b2 to extend in the direction which intersects with the first and second active regions almost at right angle, a simplified pattern of the field shape (a shape of an isolation region) in memory cell region 4 can be expected, as compared with the above-described embodiments. Thus, photolithography is facilitated and a suitable finished shape can be provided for the pattern of the field.

Fourth Embodiment

Figure 24:
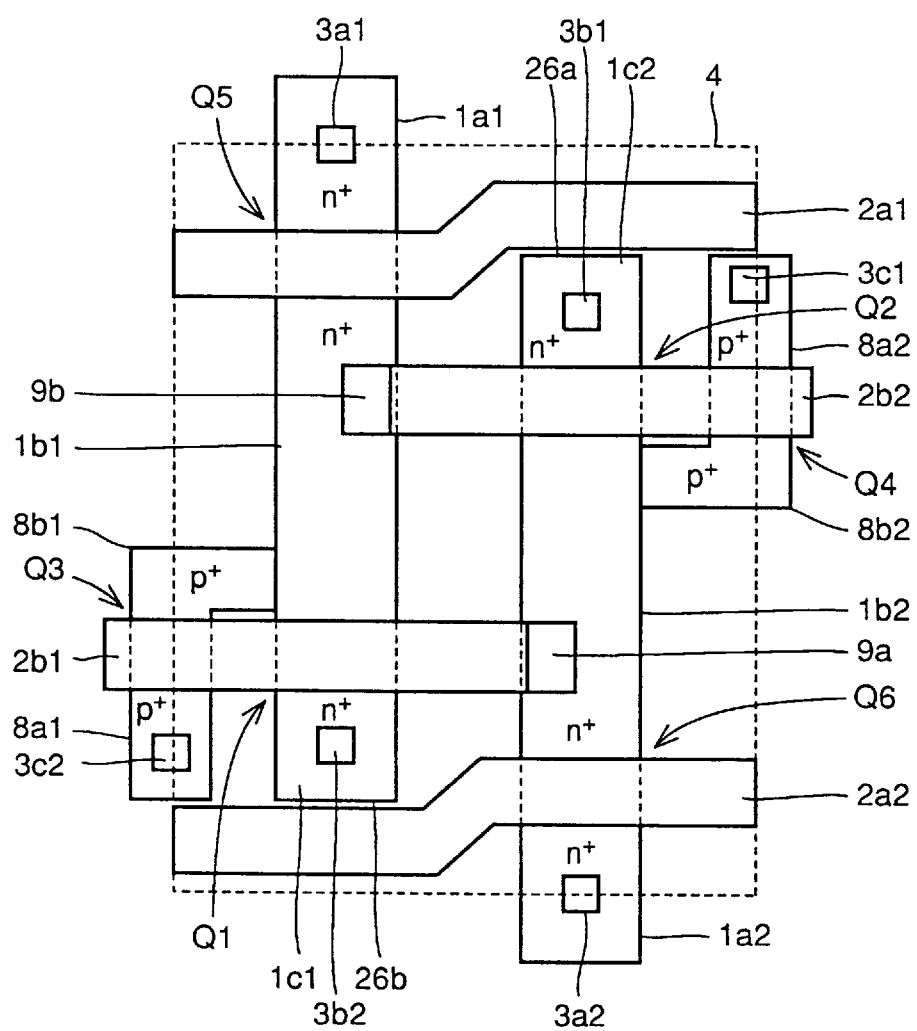
FIG. 24 is a plan view showing a lower layer portion of a memory cell region in a static semiconductor memory device in accordance with a fourth embodiment of the present invention.
Figure 25:
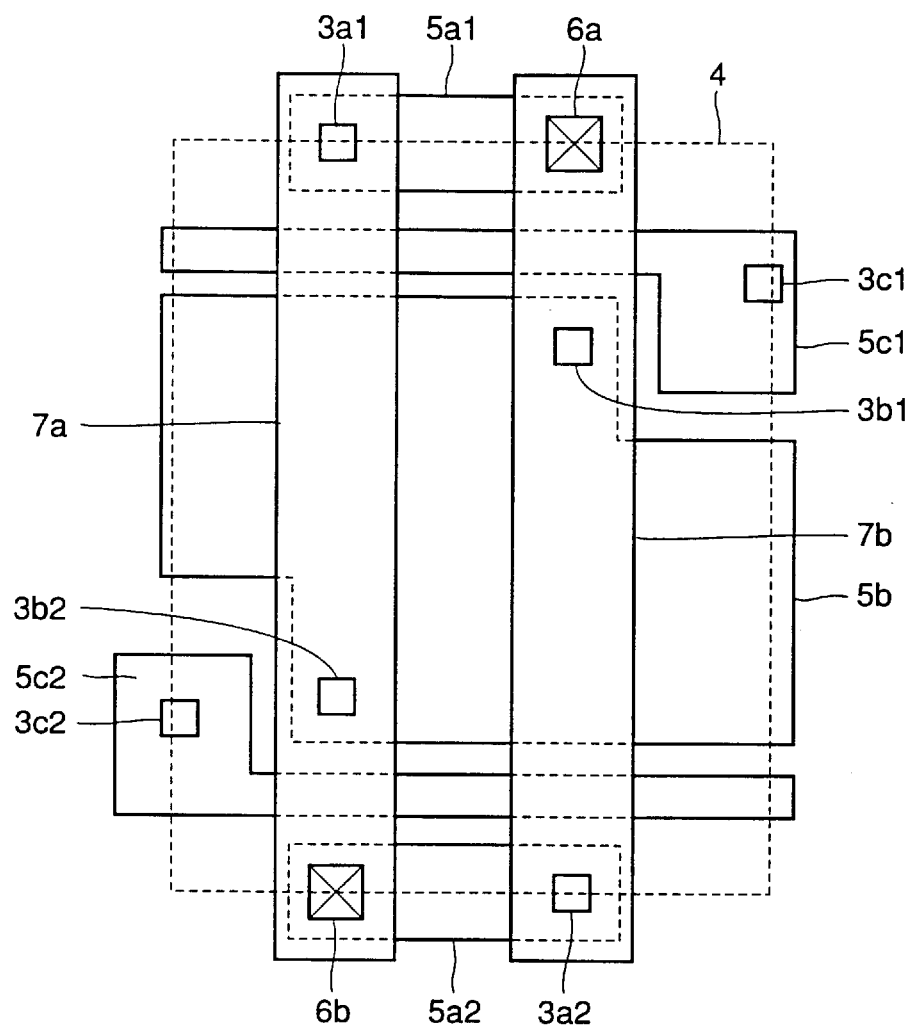
FIG. 25 is a plan view showing an upper layer portion of the memory cell region in the static semiconductor memory device in accordance with the fourth embodiment of the present invention.
Figure 26:
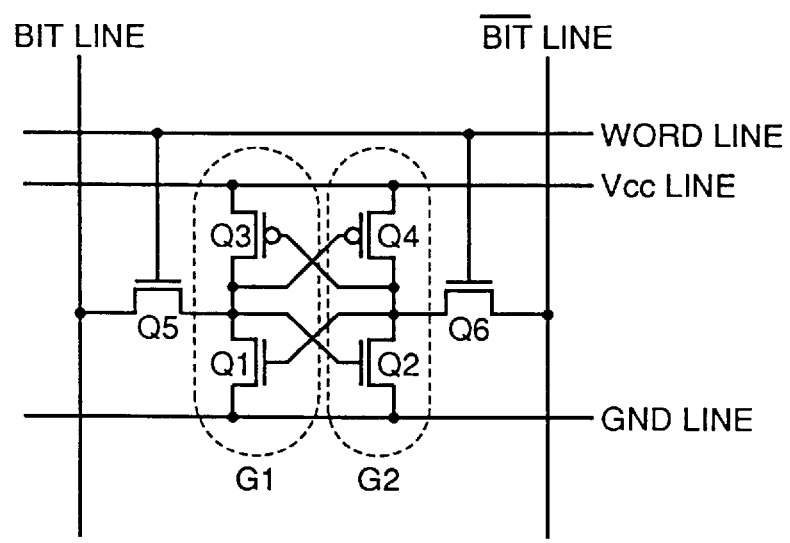
FIG. 26 is a diagram showing an equivalent circuit of a memory cell in a conventional static semiconductor memory device.
Figure 27:
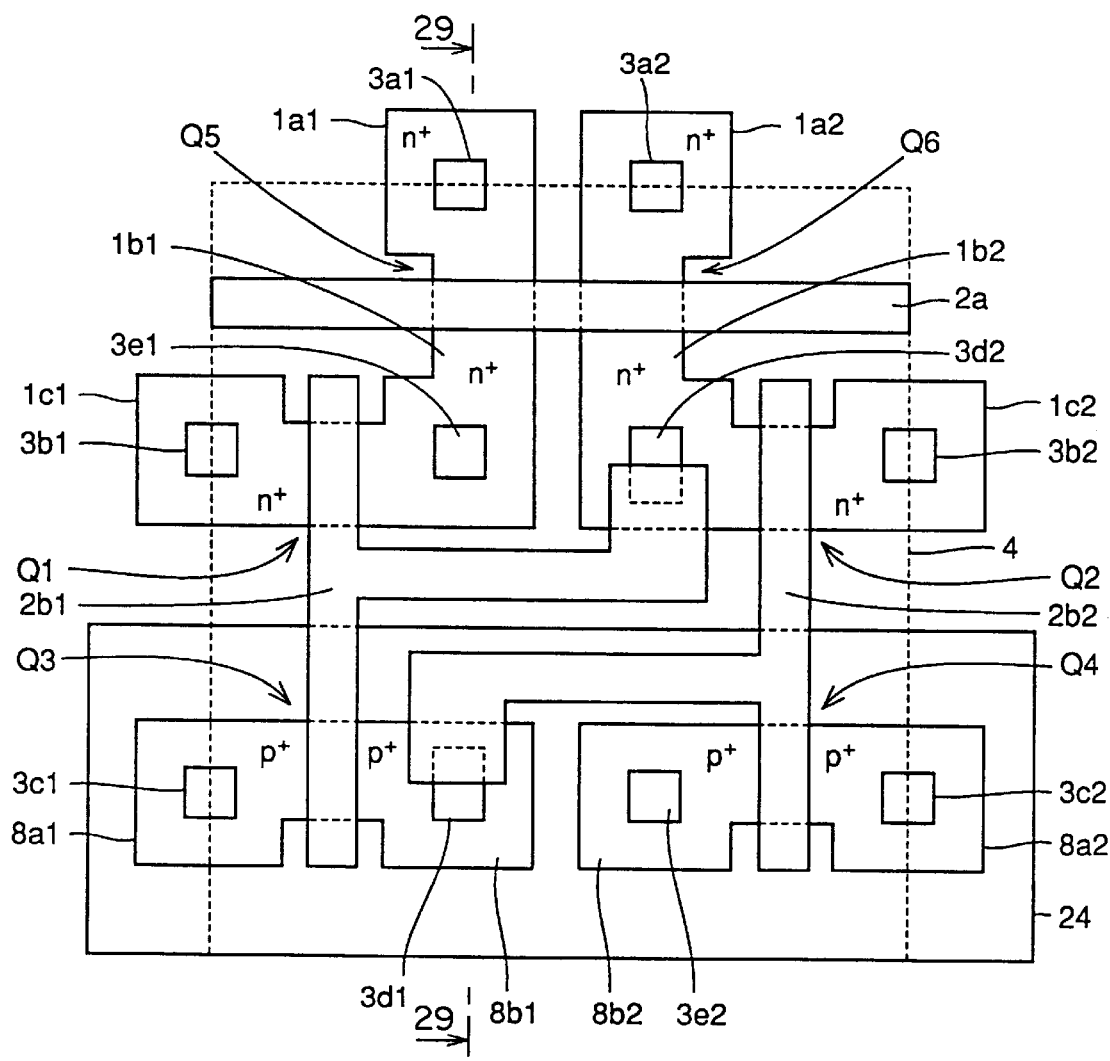
FIG. 27 is a plan view showing a lower layer portion of the memory cell region in the conventional static semiconductor memory device.
Figure 28:
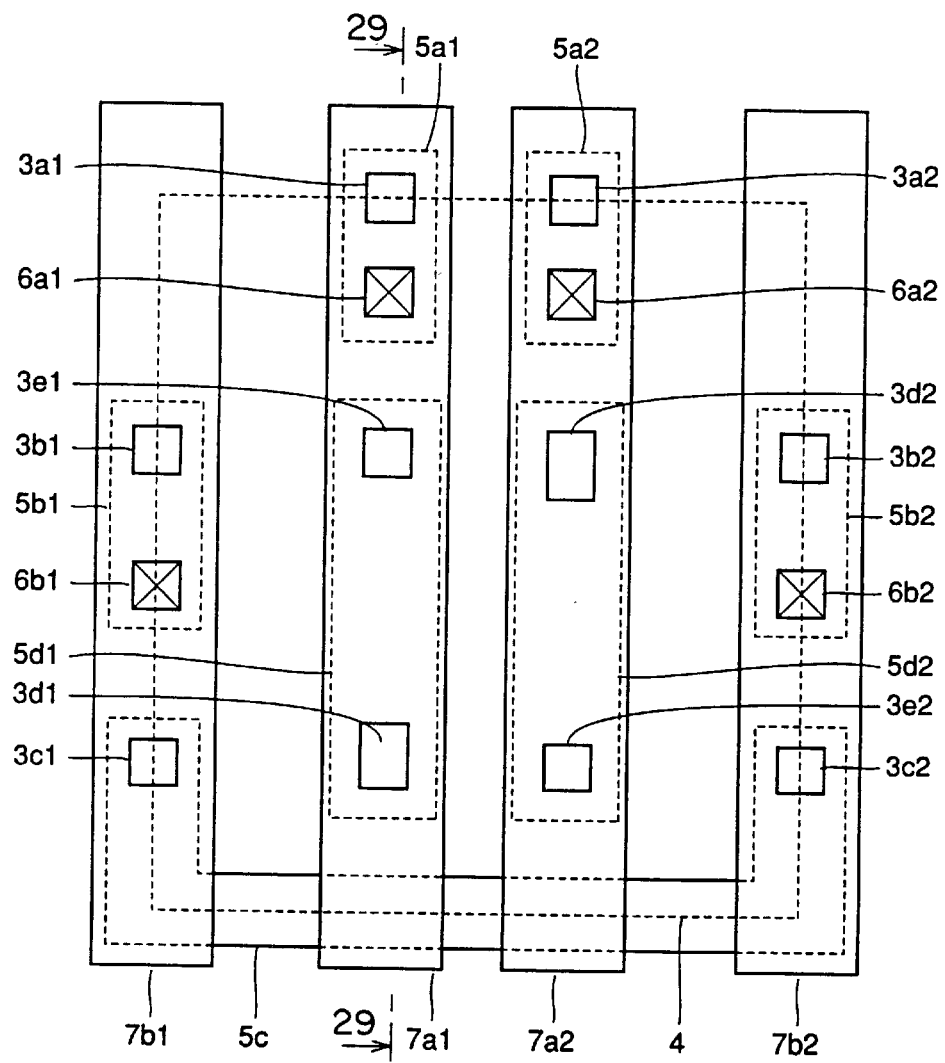
FIG. 28 is a plan view showing an upper layer portion of the memory cell region in the conventional static semiconductor memory device.
Figure 29:
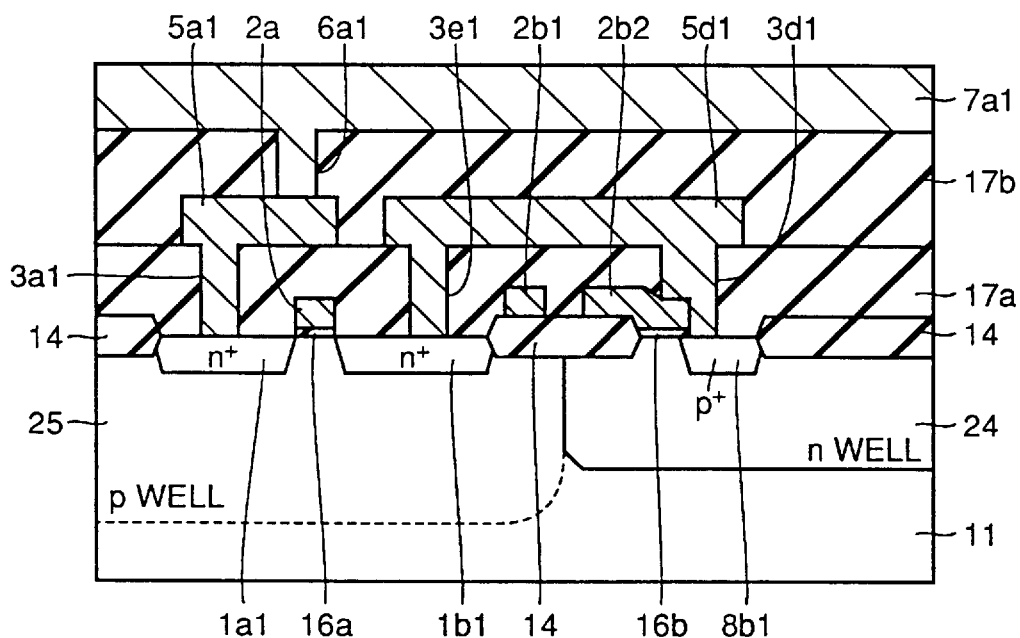
FIG. 29 is a cross sectional view taken along line 29—29 in FIGS. 27 and 28.

With reference to FIGS. 24 and 25, a fourth embodiment of the present invention will now be described. FIGS. 24 and 25 are plan views of a memory cell region 4 in a static semiconductor memory device in accordance with the fourth embodiment of the present invention.

With reference to FIG. 24, in the present embodiment, polysilicon layers 2b1 and 2b2 in straight shapes extend in a direction which is almost parallel to polysilicon layers 2a1 and 2a2. Again, first and second active regions 26a and 26b in straight shapes are formed, as in the aforementioned third embodiment. $P^+$ impurity diffusion regions 8b1 and 8b2 has bent shapes. As in the aforementioned third embodiment, a simplified pattern of the field shape can be obtained also in the present embodiment, as compared with the first and second embodiments. Effects similar to those in the third embodiment are thus expected.

It is noted that effects similar to those in the first embodiment can be expected in the present fourth and the aforementioned third embodiments. The characteristics of the above mentioned embodiments may be suitably combined.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device formed in a semiconductor layer provided on a substrate with an insulation layer interposed, comprising:

a first inverter including a first driver transistor having a pair of impurity diffusion regions of a first conductivity type and a first load transistor having a pair of impurity diffusion regions of a second conductivity type;

a second inverter including a second driver transistor having a pair of impurity diffusion regions of the first conductivity type and a second load transistor having a pair of impurity diffusion regions of the second conductivity type; and first and second access transistors each having a pair of impurity diffusion regions of the first conductivity type, gates of said first driver transistor and said first load transistor being integrated to form a first gate, gates of said second driver transistor and said second load transistor being integrated to form a second gate, a longitudinal end of said first gate extending in a first direction to be connected to one of the impurity diffusion regions of said first access transistor, a longitudinal end of said second gate extending in a second direction which is opposite from said first direction to be connected to one of the impurity diffusion regions of said second access transistor, one of the impurity diffusion regions of said first driver transistor and one of the impurity diffusion regions of said first load transistor being integrally connected to form a first drain electrode of said first inverter, and one of the impurity diffusion regions of said second driver transistor and one of the impurity diffusion regions of said second load transistor being integrally connected to form a second drain electrode of said second inverter.

2. The static semiconductor memory device according to claim 1, wherein said first drain electrode includes a first silicide layer which is integrally formed by silicidizing surfaces of said one of the impurity diffusion regions of said first driver transistor and said one of the impurity diffusion regions of said first load transistor to electrically connect the same, and said second drain electrode includes a second silicide layer which is integrally formed by silicidizing surfaces of said one of the impurity diffusion regions of said second driver transistor and said one of the impurity diffusion regions of said second load transistor to electrically connect the same.

3. The static semiconductor memory device according to claim 2, wherein third and fourth silicide layers are respectively formed on surfaces of said one of the impurity diffusion regions of said first and second access transistors, said third silicide layer extends on a sidewall and a top surface of said first gate, and said fourth silicide layer extends on a sidewall and a top surface of said second gate.

4. The static semiconductor memory device according to claim 1, wherein said first and second driver transistors are connected to a ground line through first and second contact holes, respectively, said first and second load transistors are connected to a power supply line through third and fourth contact holes, respectively, and said third and fourth contact holes are formed on same side with respect to an imaginary segment between said first and second contact holes.

5. The static semiconductor memory device according to claim 1, wherein said static semiconductor memory device includes first and second active regions in straight shapes, the pair of impurity diffusion regions of said first driver transistor and the pair of impurity diffusion regions of said second access transistor are positioned within said first active region, the pair of impurity diffusion regions of said second driver transistor and the pair of impurity diffusion regions of said first access transistor are positioned within said second active region, the pair of impurity diffusion regions of said first load transistor extend in a direction which intersects with the longitudinal direction of said first active region, and the pair of impurity diffusion region of said second load transistor extend in a direction which intersects with the longitudinal direction of said second active region.

* * * * *